(12) United States Patent
Kim

(10) Patent No.: US 6,720,667 B2
(45) Date of Patent: Apr. 13, 2004

(54) SEMICONDUCTOR DEVICE HAVING ALIGN KEY FOR DEFINING ACTIVE REGION AND METHOD FOR MANUFACTURING THE SAME

(75) Inventor: Myoung-soo Kim, Suwon (KR)

(73) Assignee: Samsung Electronics Co., LTD, Kyungki-do (KR)

( * ) Notice: Subject to any disclaimer, the term of this patent is extended or adjusted under 35 U.S.C. 154(b) by 0 days.

(21) Appl. No.: 10/307,806

(22) Filed: Dec. 2, 2002

(65) Prior Publication Data

US 2003/0127671 A1 Jul. 10, 2003

(30) Foreign Application Priority Data

Jan. 4, 2002 (KR) ............................................ 2002-502

(51) Int. Cl.⁷ ............................................ H01L 23/544
(52) U.S. Cl. ...................................... 257/797; 438/689
(58) Field of Search .......................................... 257/797

(56) References Cited

U.S. PATENT DOCUMENTS 5,414,297 A * 5/1995 Morita et al. ............... 257/797
5,640,053 A * 6/1997 Caldwell ..................... 257/797
6,049,137 A * 4/2000 Jang et al. ................... 257/797
6,326,701 B1 * 12/2001 Shinogi et al. .............. 257/797
6,590,234 B2 * 7/2003 Kim et al. ................... 257/301

OTHER PUBLICATIONS

US 6,091,158, 7/2000, Iwamatsu (withdrawn)*

* cited by examiner

Primary Examiner—Gene M. Munson
(74) Attorney, Agent, or Firm—F. Chau & Associates, LLC

(57) ABSTRACT

A semiconductor device having an align key, which is simultaneously formed by implanting ions before defining an active region, for a precise alignment with a preformed well on a semiconductor substrate when forming a photoresist pattern for defining the active region, and a method for manufacturing the same are provided The semiconductor device includes the align key formed of a first recess having a first depth from a surface of a semiconductor substrate in a scribe line region of the semiconductor substrate, and a second step portion formed by a second recess having a second depth, which is less than or equal to the first depth, from the surface of the semiconductor substrate in a well region of the semiconductor substrate.

47 Claims, 10 Drawing Sheets

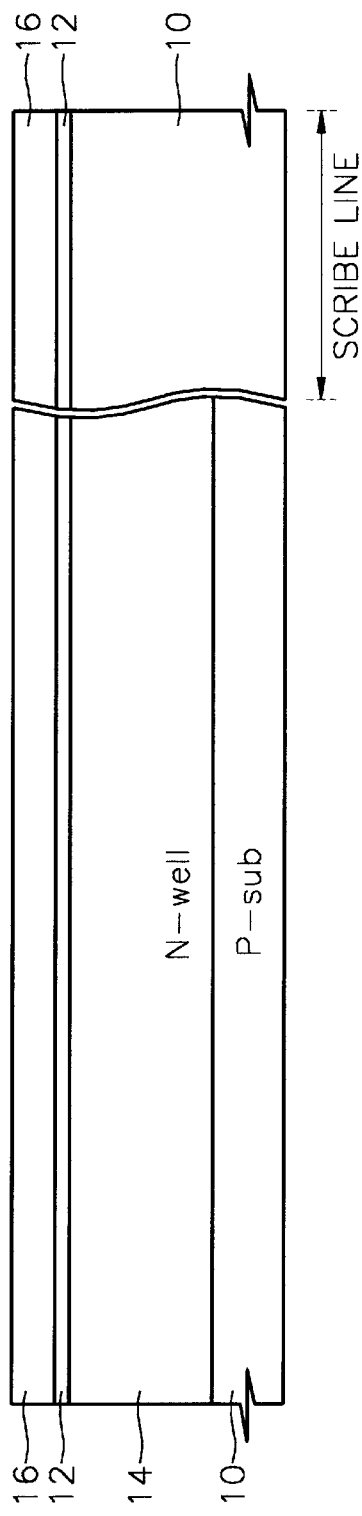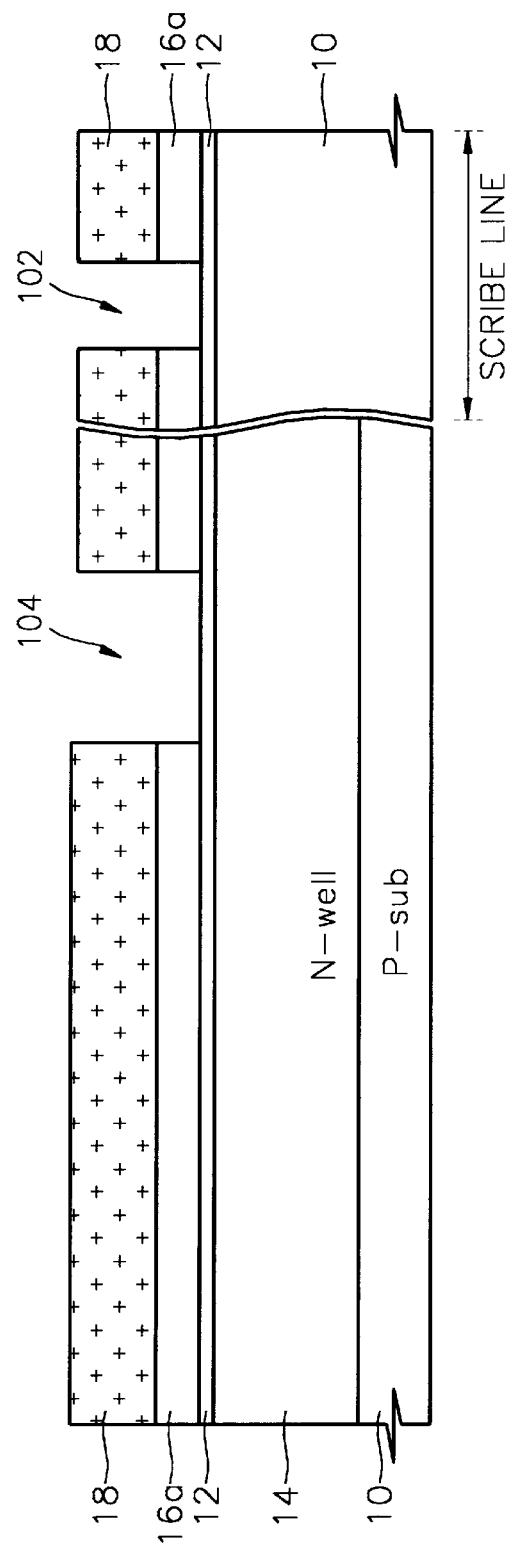

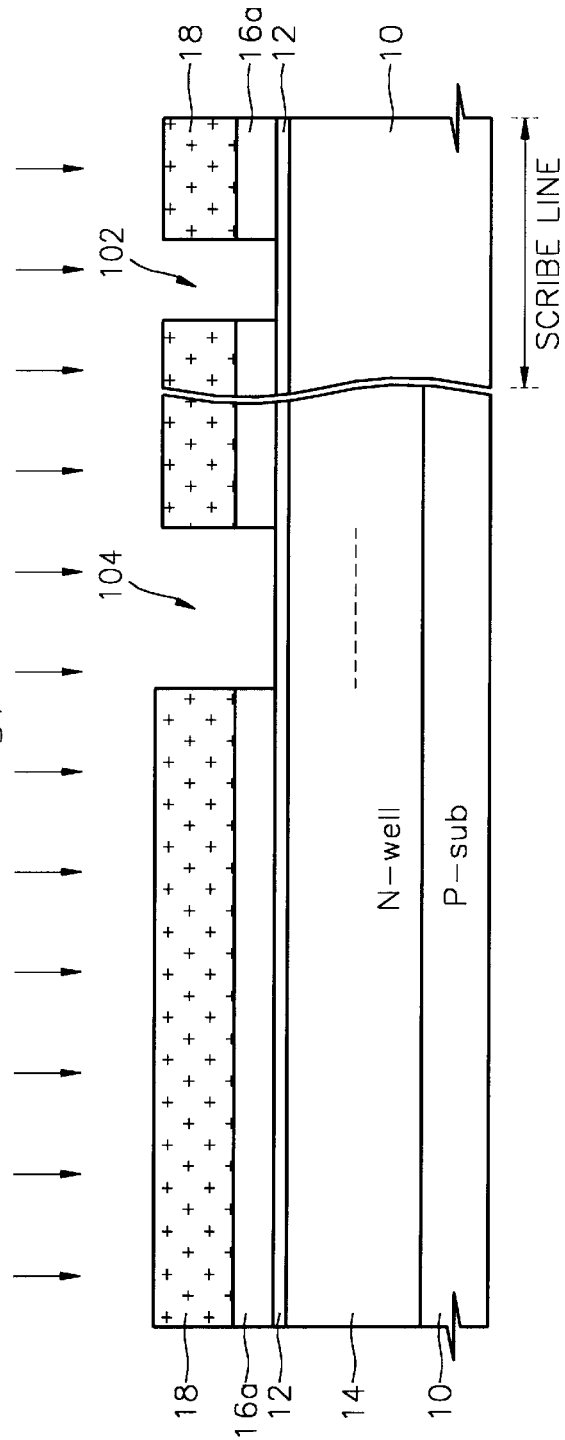
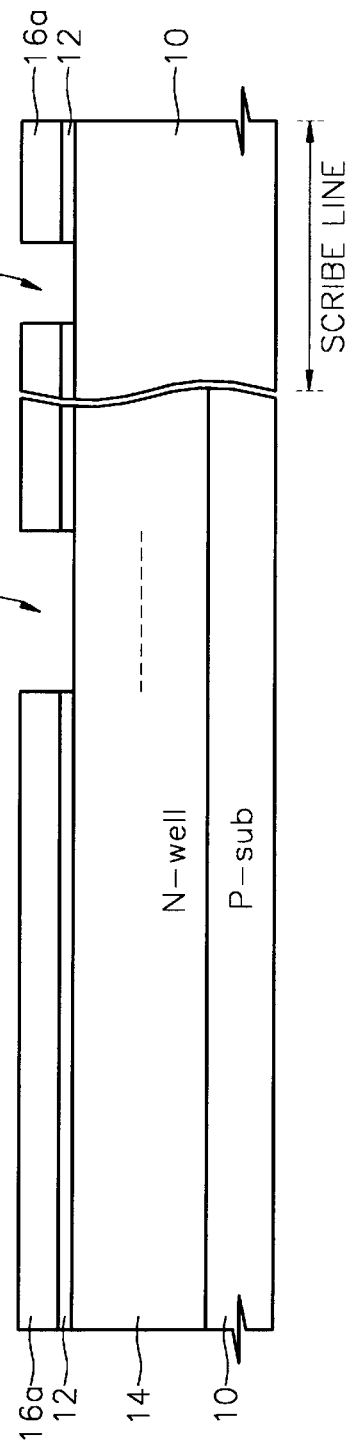

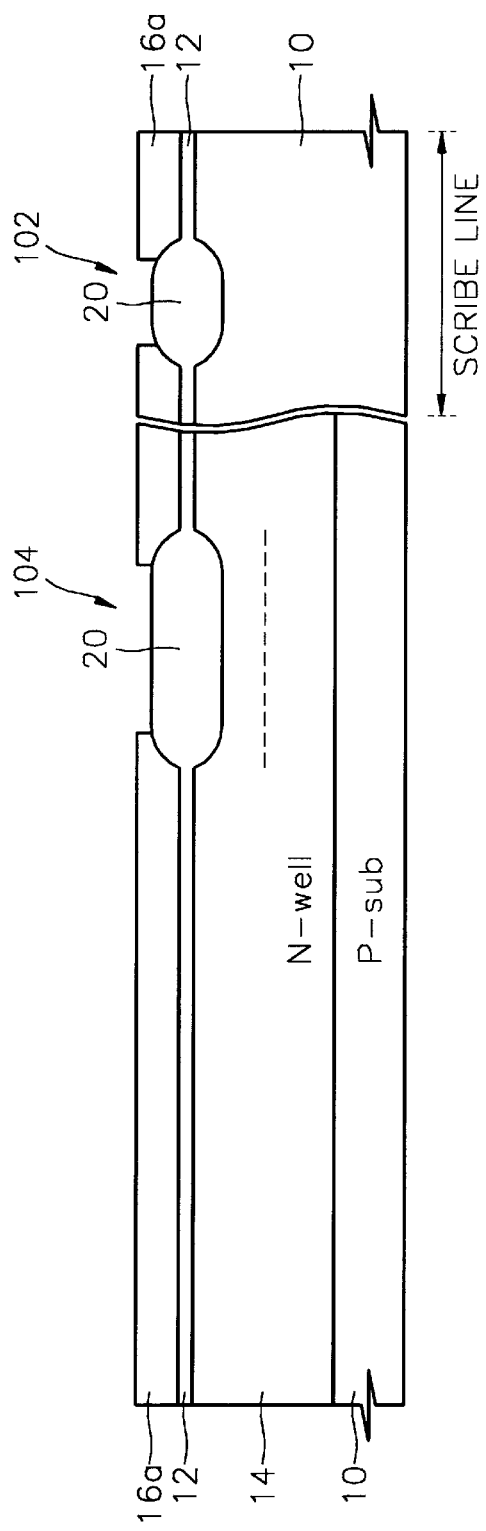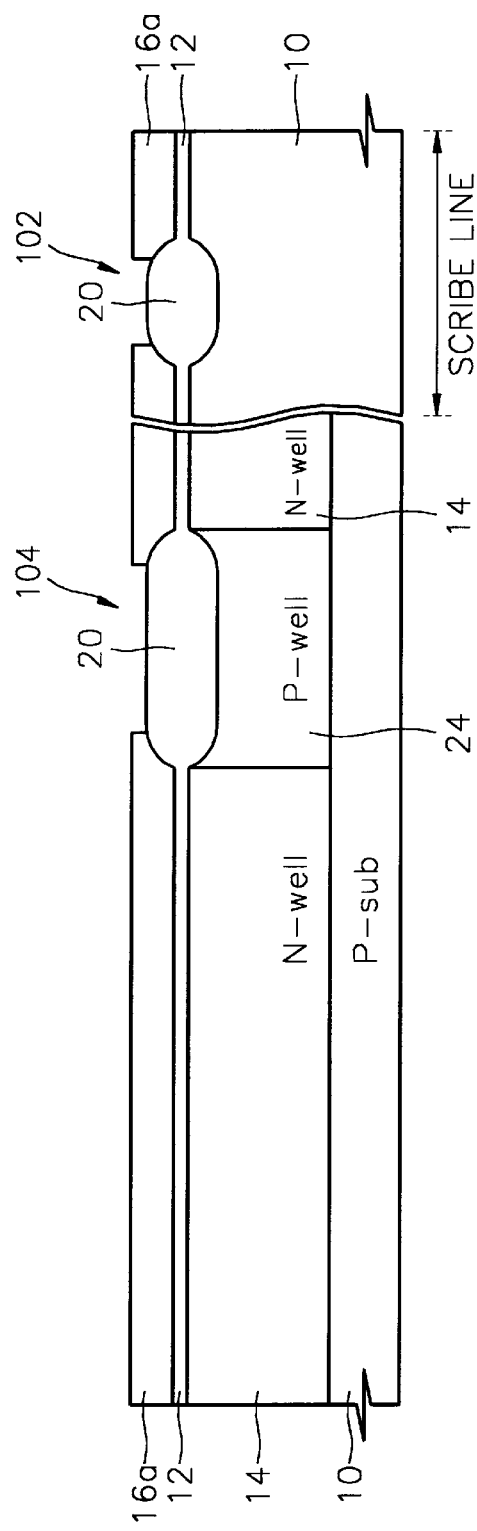

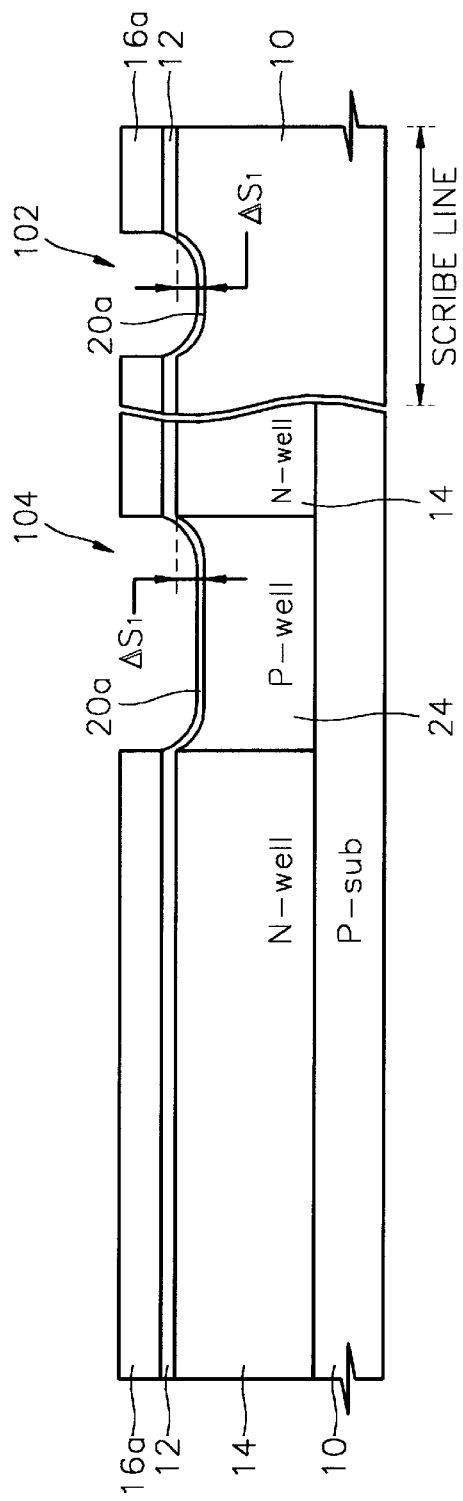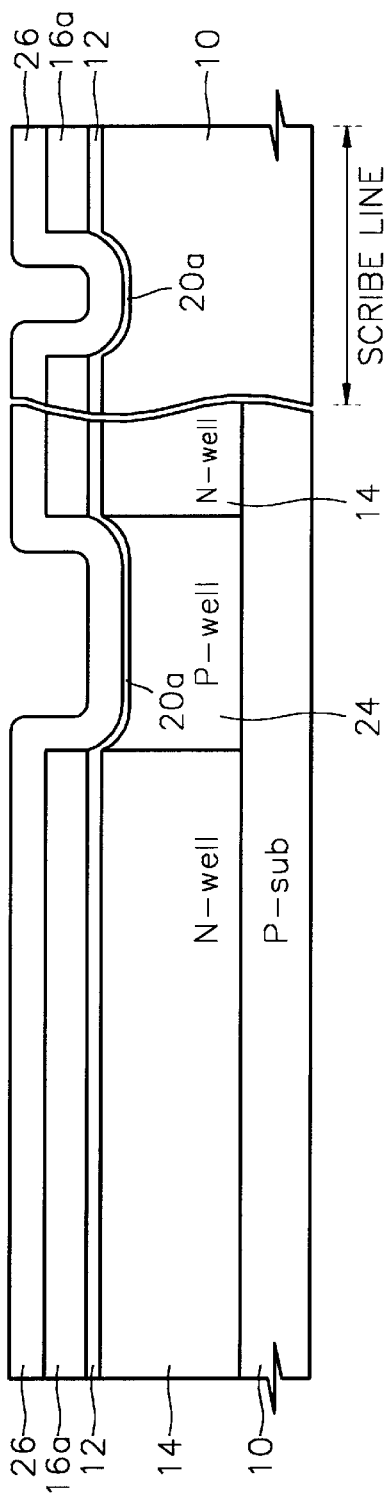

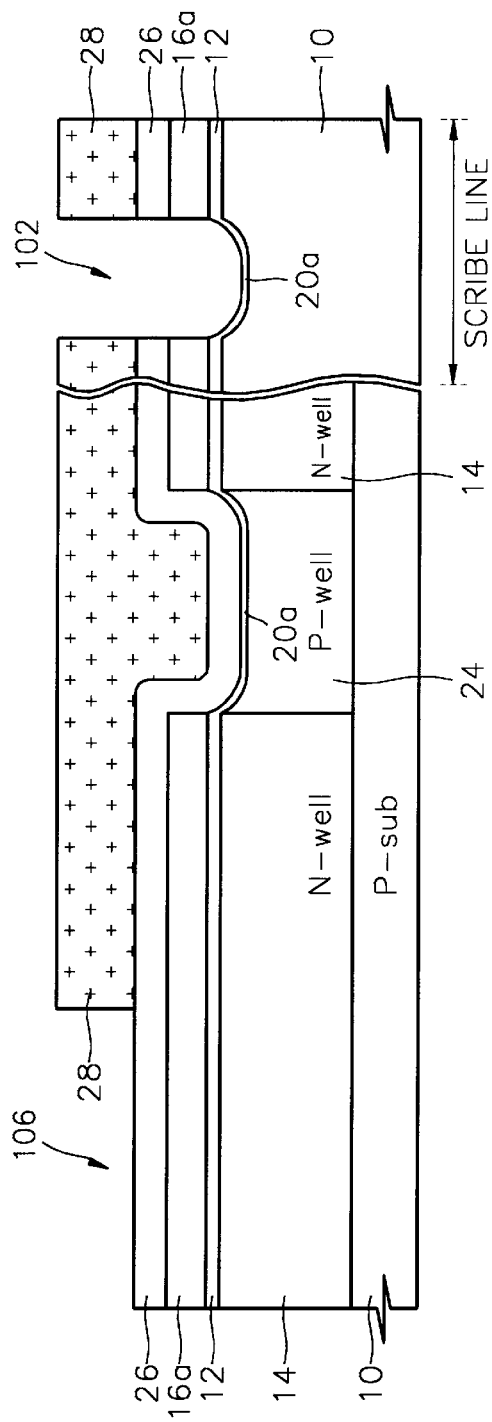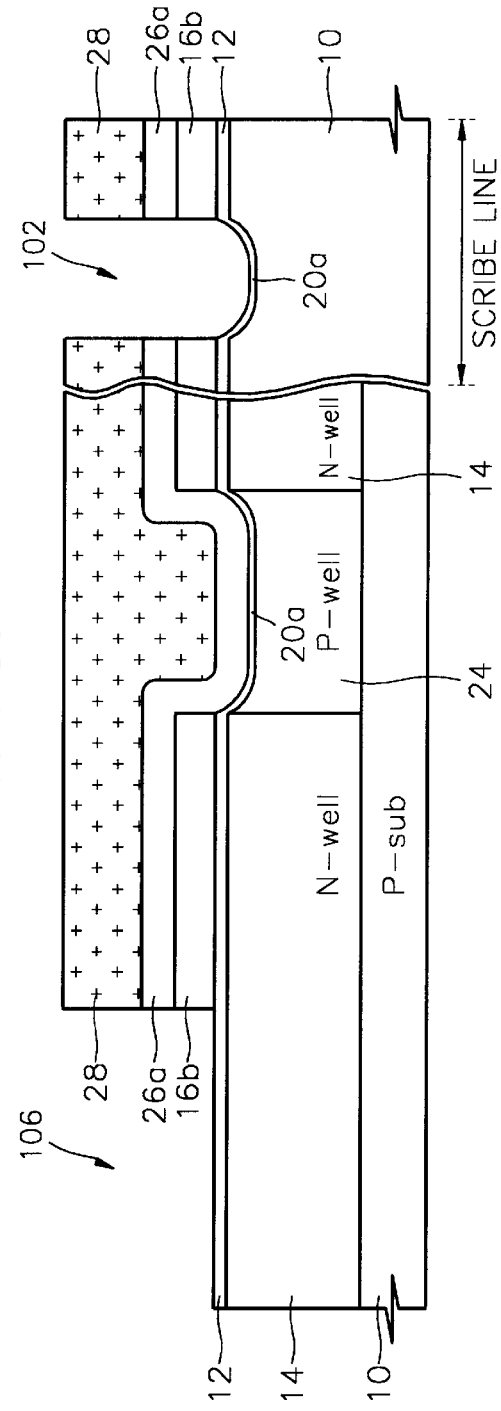

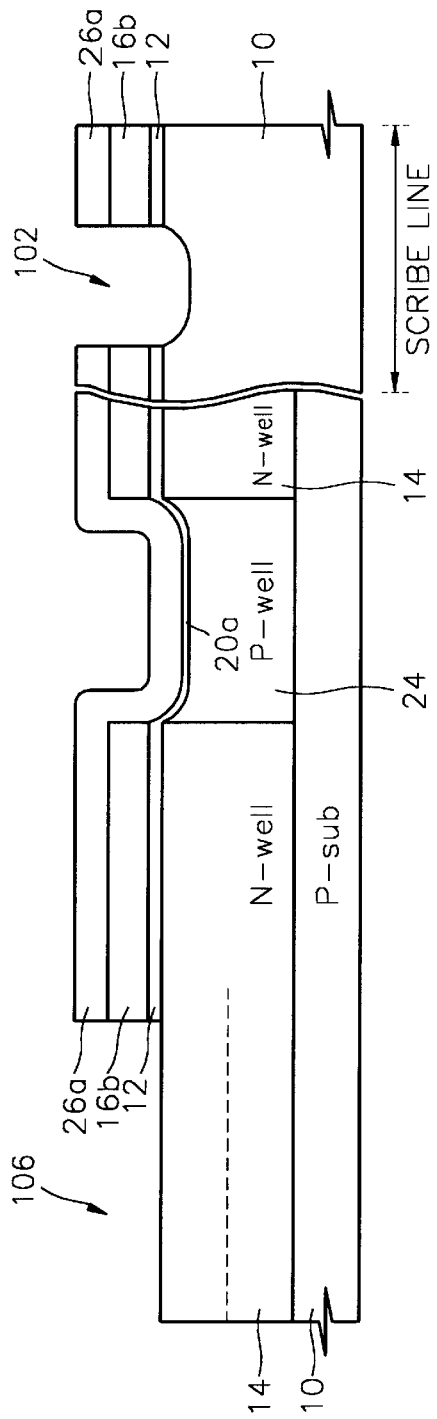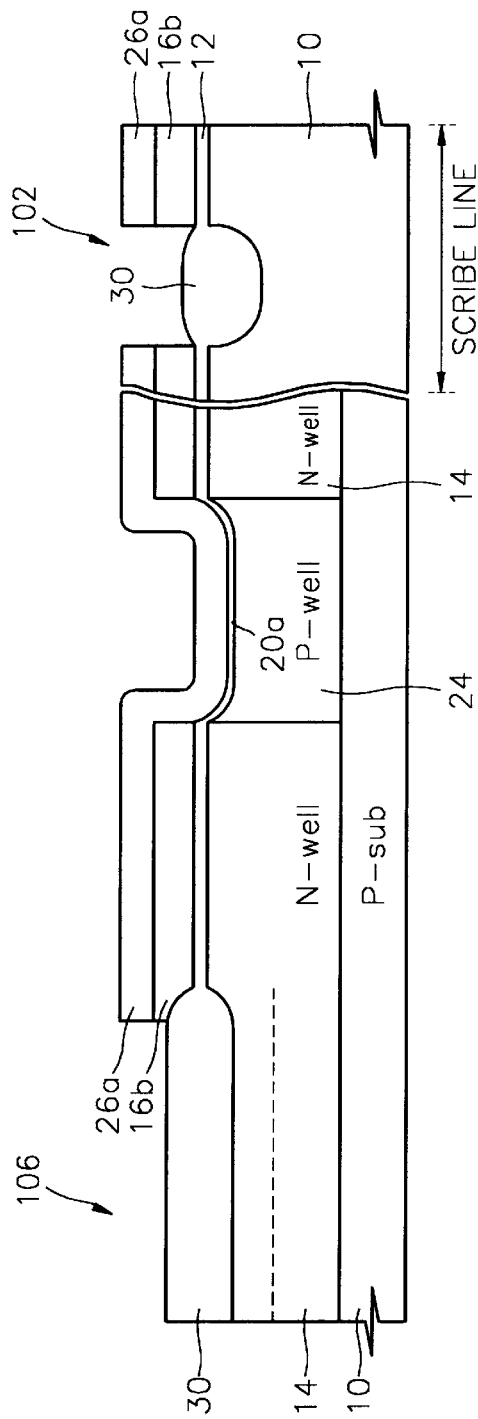

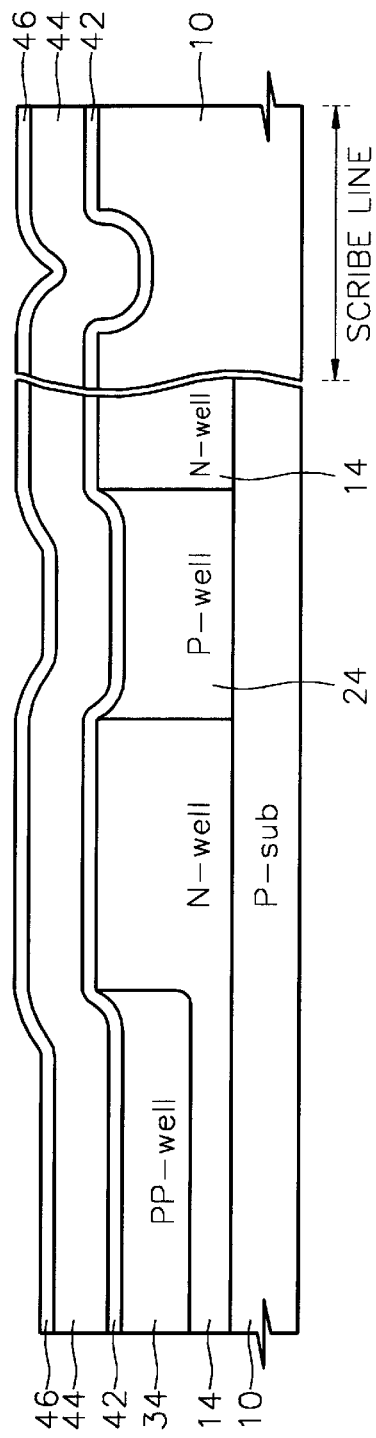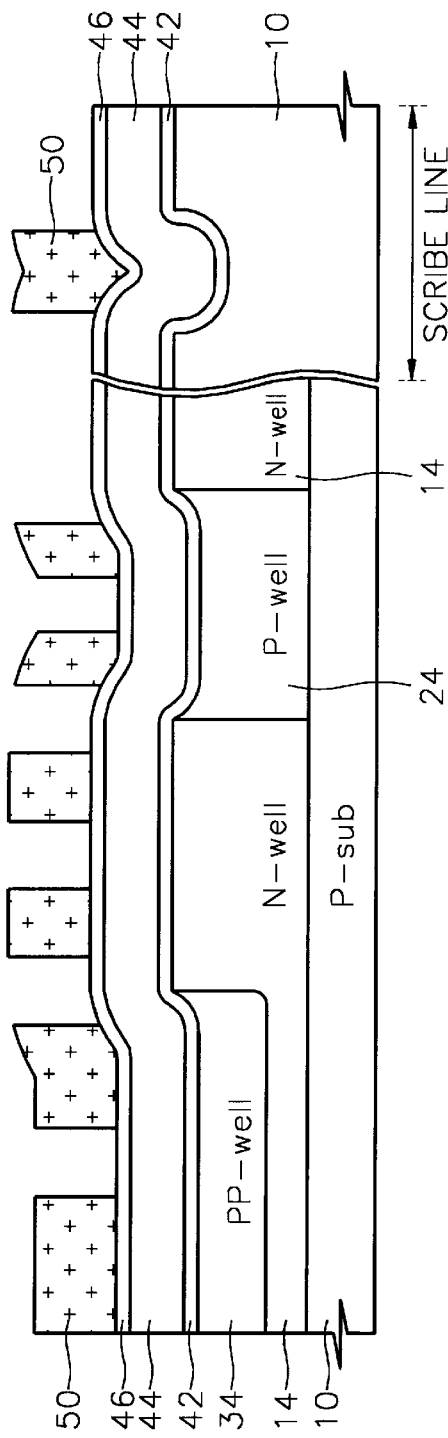

SEMICONDUCTOR DEVICE HAVING ALIGN KEY FOR DEFINING ACTIVE REGION AND METHOD FOR MANUFACTURING THE SAME

BACKGROUND OF THE INVENTION

1. Field of the Invention

The present invention relates to a semiconductor device and a method for manufacturing the same, and more particularly, to a semiconductor device, such as a high voltage device used in a liquid crystal display (LCD) driving integrated circuit, having an align key used for precise alignment when defining an active region on a semiconductor substrate having a well, and a method for manufacturing the same.

2. Description of the Related Art

To manufacture a device such as an LCD driving integrated circuit to which high voltage is applied, a process for forming a deep well is performed prior to defining an active region on a semiconductor substrate. Conventionally, a well drive-in process is used at a high temperature for a long period of time after implanting ions into the semiconductor substrate, thereby realizing a high breakdown voltage. In a conventional well forming process, when a step between the active region and the deep well is not formed on the semiconductor substrate, misalignment problems appear during a photolithography process, and the active region may not be properly defined.

To solve the above and related problems, in the conventional method for manufacturing the high voltage semiconductor device, a photoresist layer is formed on the semiconductor substrate by using a photolithography process before defining the active region on the semiconductor substrate. Then, the semiconductor substrate is etched to form a trench by using the photoresist layer as a mask to form a step in a subsequent process. The step formed by the trench is then used as an align key until an align key pattern is formed. However, in the prior art, the additional photolithography process for forming the align key before defining the active region increases the costs of manufacturing the device.

SUMMARY OF THE INVENTION

It is an aspect of the present invention to provide a semiconductor device for manufacturing a high voltage device capable of attaining high breakdown voltage by providing a precise alignment in defining an active region on a semiconductor substrate having a deep well.

It is another aspect of the present invention to provide a method for manufacturing a semiconductor device to form an align key that provides a precise alignment in a deep well forming process before defining an active region, thereby defining the active region without using an additional photolithography process.

According to a first embodiment of the present invention, a semiconductor device includes an align key formed of a first recess having a first depth from a surface of a semiconductor substrate in a scribe line region of the semiconductor substrate and a second step portion formed of a second recess having a second depth from the surface of the semiconductor substrate in a well region of the semiconductor substrate, wherein the second depth is less than or equal to the first depth.

Here, the well region is doped by a P-type dopant, and the well region has a well junction depth of about 1 to 12 $\mu$m.

The second recess includes an active region and an isolating region for defining the active region, wherein the isolating region is a trench region or a local oxidation of silicon (LOCOS) isolating region.

According to a further embodiment of the present invention, a semiconductor device includes an align key formed of a first recess having a first depth from a surface of a semiconductor substrate in a scribe line region of the semiconductor substrate, a second step portion formed of a second recess having a second depth from the surface of the semiconductor substrate in a first well region of the semiconductor substrate, and a third step portion formed of a third recess having a third depth from the surface of the semiconductor substrate in a second well region of the semiconductor substrate, wherein the third depth is smaller than the first depth.

It is preferable that the depth of the third recess is the same as the depth of the second recess.

The first well region is a P-well region, and the second well region is a pocket P-well region.

In addition, the second and third recesses include active regions and isolating regions for defining the active regions, respectively, wherein the isolating regions are trench regions or LOCOS isolating regions.

According to another embodiment of the present invention, a method for manufacturing a semiconductor device includes forming an N-well on a P-type silicon substrate having a scribe line region and a device region. A P-type dopant is first implanted into a portion of the scribe line region and into a first region of the device region on the silicon substrate having the N-well. First oxide layers having a predetermined thickness are formed on the portion of the scribe line region and the first region by oxidizing a surface of the silicon substrate. A P-well is formed in the first region by diffusing the P-type dopant, which is implanted into the first region, into the silicon substrate having the first oxide layer. A first step portion is formed on the surface of the silicon substrate in the scribe line region by removing the first oxide layer formed in the scribe line region. A second step portion is formed on the surface of the P-well by removing the first oxide layer formed in the first region. An align key is formed in the scribe line region by using the first step portion.

It is preferable that the P-type dopant is boron ions in the first implanting process, and the first oxide layer has a thickness of about 500 to 5000 Å.

In addition, the P-well has a junction depth of about 1 to 12 $\mu$m from the surface of the silicon substrate in forming the P-well.

It is preferable that removing the first oxide layer formed in the scribe line region and removing the first oxide layer formed in the first region are performed by a wet etching process, respectively.

It is preferable that removing the first oxide layer for forming the first and second step portions are simultaneously performed.

According to this embodiment, the method further includes forming a first ion implantation mask pattern, which exposes only the portion of the scribe line region and the first region after forming the N-well and before the first implanting the P-type dopant. Here, the first ion implantation mask pattern is formed of a silicon nitride layer.

The method further includes second implanting a P-type dopant into the portion of the scribe line region and a second region of the device region, on the silicon substrate having the first and second step portions, before forming the align key. Thereafter, second oxide layers having a predetermined thickness are formed on the first step portion in the scribe line region and on the second region by oxidizing the surface of the silicon substrate. A pocket P-well is formed in the second region by diffusing the P-type dopant, which is implanted into the second region, into the silicon substrate having the second oxide layers. An align key forming step portion is formed on the silicon substrate surface in the scribe line region by removing the second oxide layer from the first step portion. Next, a third step portion is formed on the surface of the pocket P-well by removing the second oxide layer from the second region.

It is preferable that the pocket P-well has a junction depth of about 1 to 12 µm from the surface of the semiconductor, which is smaller than the junction depth of the P-well, in forming the pocket P-well.

It is preferable that removing the second oxide layer from the first step portion and removing the second oxide layer from the second region are formed by a wet etching process, respectively. It is preferable that removing the second oxide layer for forming the align key forming step portion and removing the second oxide layer for forming the third step portion are performed simultaneously.

It is preferable that a portion of the first oxide layer is removed for remaining a first oxide layer remaining layer having a predetermined thickness in the portion of the scribe line region on the surface of the silicon substrate, in removing the first oxide layer for forming the first step portion. The act of second implanting is performed in the first oxide layer remaining layer in the portion of the scribe line region.

The align key forming step portion has a larger depth than the second and the third step portions.

In the method for manufacturing a semiconductor device, a first ion implantation mask pattern for exposing the portion of the scribe line region and the first region is formed after forming N-well and before first implanting the P-type dopant, and a second ion implantation mask for exposing only the portion of the scribe line region and the second region is formed before the second implanting the P-type dopant. It is preferable that the second ion implantation mask pattern is formed on the first ion implantation mask pattern. The second ion implantation mask pattern is formed of a silicon nitride layer.

The method for manufacturing a semiconductor device according to the an embodiment of the present invention further includes forming a photoresist pattern for defining an active region on the silicon substrate, by using the first step portion as an align key.

In a method for manufacturing a semiconductor device according to another embodiment of the present invention, a first silicon nitride layer pattern is formed in a scribe line region of a silicon substrate to expose a portion of a surface of the silicon substrate. A first oxide layer is formed by oxidizing the exposed surface of the silicon substrate. A first step portion having a first recess is formed in the scribe line region, by removing the first oxide layer. An align key for defining an active region is formed by using the first step portion.

According to the various embodiments of the present invention, since an additional photolithography process is not required in an align key forming process for a precise alignment when defining an active region on a semiconductor substrate, an align key is economically formed. Consequently, a manufacturing cost for a high voltage device capable of high breakdown voltage is lowered.

BRIEF DESCRIPTION OF THE DRAWINGS

The above aspects and advantages of the present invention will become more apparent by describing in detail preferred embodiments thereof with reference to the attached drawings in which:

FIGS. 1 through 19 are sectional views illustrating a method for manufacturing a semiconductor device according to preferred embodiments of the present invention.

DETAILED DESCRIPTION OF PREFERRED EMBODIMENTS

Figure 1:
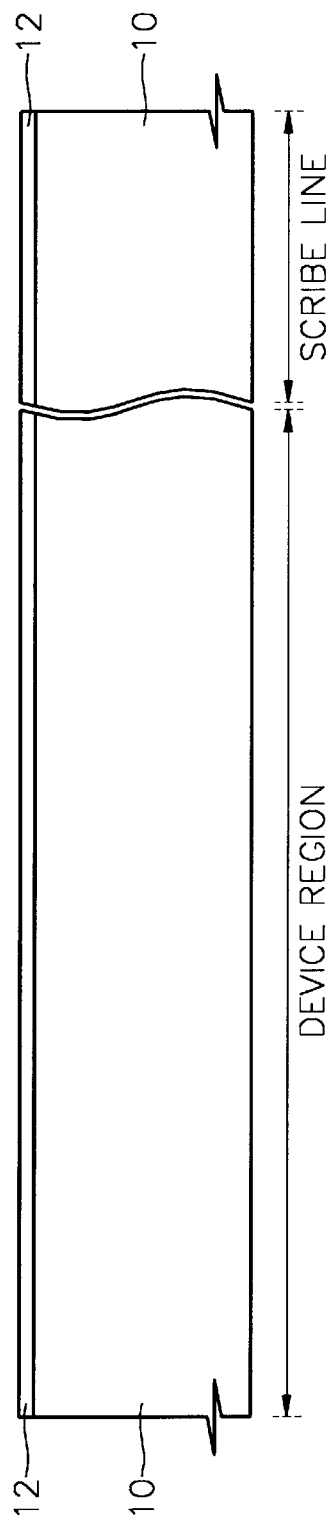

The present invention may be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 1 through 19 are sectional views illustrating a method for manufacturing a semiconductor device according to preferred embodiments of the present invention. In the embodiments of the present invention, a deep well is formed before defining an active region on a semiconductor substrate for forming a high breakdown voltage of 15 to 120 V. An align key required for a precise alignment in defining the active region is formed by a deep well forming process. The method for forming the semiconductor device will be now described in detail.

Figure 2:
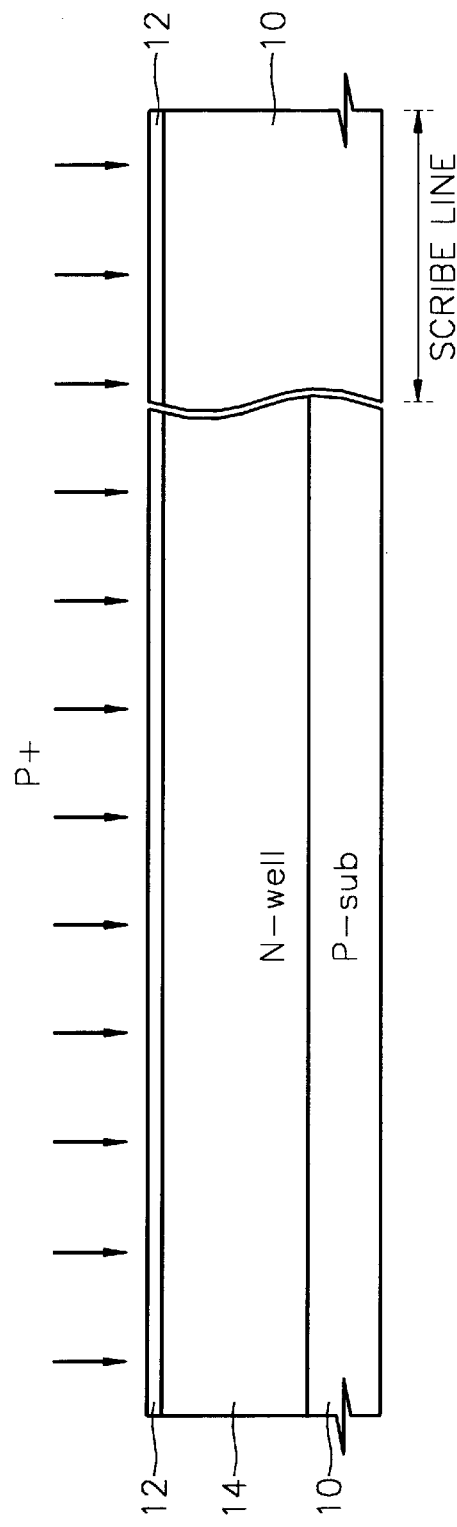

Referring to FIG. 1, a pad oxide layer 12 having a thickness of about 200 Å is formed on a semiconductor substrate 10, such as a P-type silicon substrate, having a scribe line region and a device region. Referring to FIG. 2, an N-type dopant, e.g., phosphorous (P+) ions, is blanket implanted into the semiconductor substrate 10 having the pad oxide layer 12 at an accelerating voltage of about 1.8 MeV and a dose of about $5.0 \times 10^{12}/cm^3$, thereby forming an N-well 14.

Referring to FIG. 3, a first silicon nitride layer 16 of a thickness of about 1000 Å is formed on the pad oxide layer 12 so as to form an ion implantation mask for forming a P-well on the semiconductor substrate 10 to which the phosphorous (P+) ions have been implanted.

Referring to FIG. 4, a first photoresist pattern 18 is formed on the first silicon nitride layer 16 for etching the first silicon nitride layer 16 by using the first photoresist pattern 18, thereby forming a first ion implantation mask pattern 16a. The first ion implantation mask pattern 16a exposes the semiconductor substrate 10, which is covered by the pad oxide layer 12, at a portion of the scribe line region 102 and a first region 104 for a P-well region in the device region.

Referring to FIG. 5, a P-type dopant, e.g., boron (B+) ions, is implanted into a resultant structure having the first ion implantation mask pattern 16a at an accelerating voltage of about 500 KeV and a dose of about $8.0 \times 10^{12}/cm^3$. Consequently, the boron (B+) ions are implanted only into a portion of the scribe line region 102 and the first region for the P-well region 104 in the device region.

Referring to FIG. 6, the first photoresist pattern 18 and the exposed portion of the pad oxide layer 12 are removed. As a result, the silicon surface of the semiconductor substrate 10 is exposed at the portion of the scribe line region 102 and the first region for the P-well region 104 in the device region, through the first ion implantation mask pattern 16a. Referring to FIG. 7, the silicon surface of the semiconductor substrate 10, which is exposed at the portion of the scribe line region 102 and the first region for the P-well region 104 in the device region, is oxidized in an oxygen atmosphere, thereby forming first oxide layers 20 at the portion of the scribe line region 102 and the first region 104. The first oxide layer 20 is formed to have a thickness of about 500 to 5000 Å. It is preferable that the first oxide layer 20 is formed to have a thickness of about 1000 Å. When the silicon surface before oxidizing the semiconductor substrate 10 is used as a reference, the silicon oxide layer is grown downward where an interface between the oxide layer and the silicon surface is formed, for about 44% of total layer thickness, and grown upward where the surface of the silicon oxide layer is formed, for about 56% of total layer thickness. Consequently, when the first oxide layer 20 is formed with a thickness of about 1000 Å, a distance from the interface between the first oxide layer 20 and the semiconductor substrate 10 to the upper surface of the semiconductor substrate 10 is about 440 Å.

Referring to FIG. 8, a well drive-in process is performed at a temperature of about 1100° C. for about 13 hours to diffuse the P-type dopant implanted into the first region 104 of the device region into the semiconductor substrate 10. As a result, a P-well 24 is formed in the first region of the device region on the semiconductor substrate 10. The P-well 24 has a junction depth of about 1 to 12 μm from the surface of the semiconductor substrate 10.

Referring to FIG. 9, the first oxide layer 20 exposed through the first ion implantation mask pattern 16a is removed by wet etching, which uses a buffered oxide etchant (BOE). In this case, the first oxide layer 20 is not completely removed, but first oxide layer remaining layers 20a of a predetermined thickness, for example about 150 Å, remain on the semiconductor substrate 10 in the portion of the scribe line region 102 and the first region 104. The first oxide layers 20 may be completely removed including the first oxide layer remaining layers 20a so as to form additional pad oxide layers of about 150 Å on the semiconductor substrate 10 in the portion of the scribe line region 102 and the first region 104.

As shown in FIG. 9, step portions are formed in the portion of the scribe line region 102 and the first region 104 by recesses having a depth of $S_1$ from the surface of the semiconductor substrate 10. The depths of the step portions in the portion of the scribe line region and the first region are substantially the same.

Referring to FIG. 10, a second silicon nitride layer 26 is formed to completely cover the first oxide layer remaining layers 20a, remained on the step portions, and the first ion implantation mask pattern 16a.

Referring to FIG. 11, a second photoresist pattern 28 is formed on the second silicon nitride layer 26. The second photoresist pattern 28 is formed to expose the second silicon nitride layer 26 at the portion of the scribe line region 102 and at a second region 106 of the device region where a pocket P-well will be formed.

Referring to FIG. 12, the second silicon nitride layer 26 and the first ion implantation mask pattern 16a are successively etched by using the second photoresist pattern 28, thereby forming an etched first ion implantation mask pattern 16b and a second ion implantation mask pattern 26a on the first implantation mask pattern 16b. The second ion implantation mask pattern 26a exposes the step portion of the semiconductor substrate 10 covered by the first oxide layer remaining layer 20a at the portion of the scribe line region 102, and exposes the semiconductor substrate 10 covered by the pad oxide layer 12 at the second region 106 for the pocket P-well in the device region.

Figure 13:
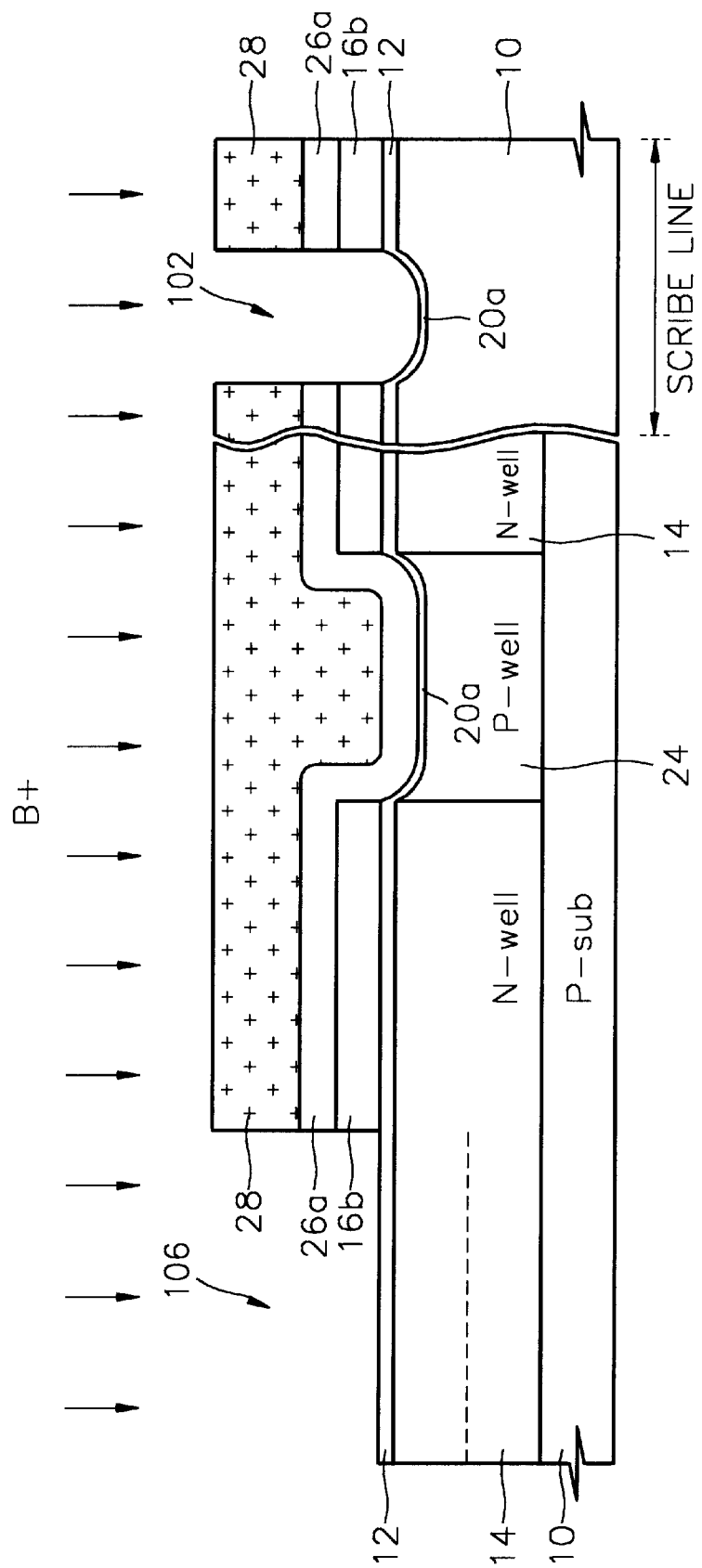

Referring to FIG. 13, a P-type dopant, e.g., boron (B+) ions, is implanted into a resultant structure having the second ion implantation mask pattern 26a, at an accelerating voltage of about 300 KeV and a dose of about $4.0 \times 10^{12}/cm^3$. As a result, the boron ions are implanted only into the portion of the scribe line region 102 and the second region 106.

Referring to FIG. 14, the second photoresist pattern 28, the exposed portion of the pad oxide layer 12, and the first oxide layer remaining layer 20a remaining on the step portion of the scribe line region are then removed. Consequently, the silicon surface of the semiconductor substrate 10 is exposed at the step portion of the scribe line region 102 and the second region 106 for the pocket P-well in the device region, through the second ion implantation mask pattern 26a.

Referring to FIG. 15, the silicon surface of the semiconductor substrate 10, which is exposed at the step portion in the scribe line region 102 and the second region 106 of the device region, is oxidized in the oxygen atmosphere, thereby forming second oxide layers 30 in the portion of the scribe line region 102 and the second region 106. The second oxide layers 30 are formed to have a thickness of about 500 to 5000 Å. It is preferable that the second oxide layer 30 is formed with a thickness of about 1000 Å

As described in FIG. 7, when the silicon surface before oxidizing the semiconductor substrate 10 is taken as the reference, the silicon oxide layer is grown downward where an interface between the oxide layer and the silicon surface is formed, for about 44% of total layer thickness, and grown upward where the surface of the silicon oxide layer is formed, for about 56% of total layer thickness. Accordingly, when the second oxide layers 30 are formed with a thickness of about 1000 Å, the distance from the interface between the second oxide layer 30 and the semiconductor substrate 10 to the upper surface of the semiconductor substrate 10 is about 880 Å at its maximum in the scribe line region, and the distance from the interface between the second oxide layer 30 and the semiconductor substrate 10 to the upper surface of the semiconductor substrate 10 is about 440 Å at its maximum in the second region.

Figure 16:
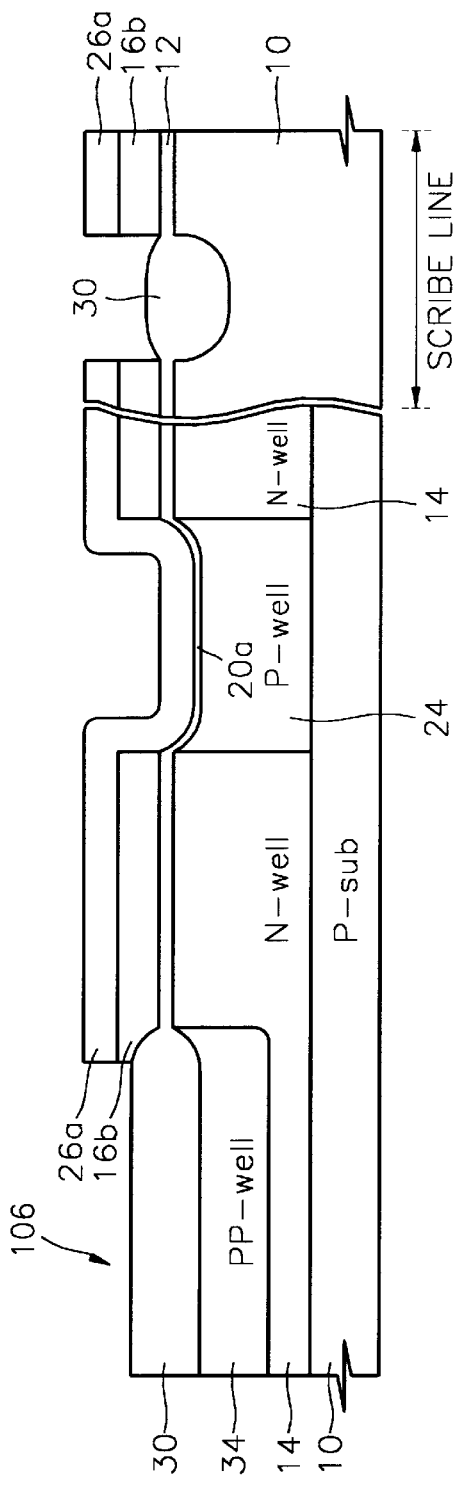

Referring to FIG. 16, a well drive-in process is performed at a temperature of about 1100° C. for about 13 hours to diffuse the P-type dopant, which is implanted into the second region 106 of the device region, into the semiconductor substrate 10. Consequently, a pocket P-well (PP-well) 34 is formed in the second region 106 of the device region on the semiconductor substrate 10. The pocket P-well 34 is formed to have a junction depth of about 1 to 12 μm from the surface of the semiconductor substrate 10 for being narrower than the junction depth of the N-well 14.

Figure 17:
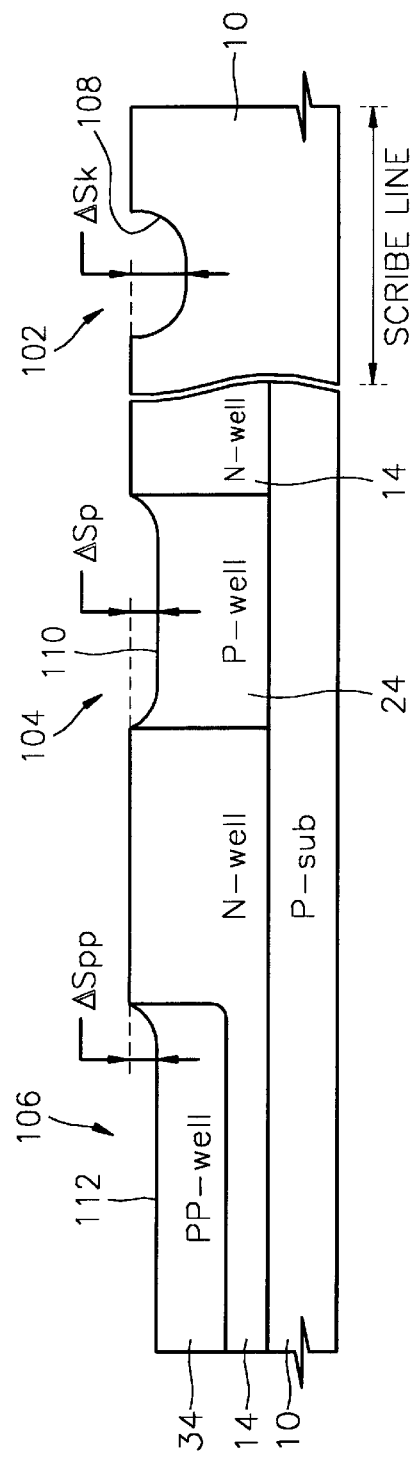

Referring to FIG. 17, the second oxide layers 30, the second ion implantation mask pattern 26a, the etched first ion implantation mask pattern 16b, the first oxide layer remaining layer 20a, and the pad oxide layer 12 are removed from the semiconductor substrate 10. In this case, the wet etching process, by using the BOE, may be used to remove the second oxide layers 30, the first oxide layer remaining layer 20a, and the pad oxide layer 12.

As a result, an align key forming step portion 108, which is formed by a recess with a first depth Sk on the surface of the semiconductor substrate 10, is exposed in the scribe line region. The align key forming step portion 108 in the scribe line region provides a sufficient step for a precise alignment in a photoresist pattern forming process for defining an active region.

A second step portion 110, which is formed on the semiconductor substrate 10 by a recess having a second depth Sp narrower than the first depth Sk, is exposed in the first region 104 of the device region. Also, a third step portion 112, which is formed on the semiconductor substrate 10 by a recess having a third depth Spp narrower than the first depth Sk, is exposed in the second region 106 of the device region. As described above, the portion of the scribe line region 102 is exposed in the second oxidizing process for forming the second oxide layers 30 as well as in the first oxidizing process for forming the first oxide layers 20, so that the align key forming step portion 108 having the first depth Sk is formed in the scribe line region. To not affect the performance of the device in the device region, the first region 104 for the P-well 24 and the second region 106 for the pocket P-well 34 are exposed to the oxidizing process once, respectively. As a result, the step portions 110, 112 formed in the first and second regions, respectively, have the second depth Sp and the third depth Spp that are narrower than the first depth Sk. Consequentially, the performance of the device is unaffected by the formation of a device isolating region by using a shallow trench isolation (STI) process in a subsequent device isolating process. In the case of using a local oxidation of silicon (LOCOS) process, the depths of the step portions formed in the first and second regions are not critical. Accordingly, the depths of the step portions in the first and second regions may be the same as the first depth Sk. It is well known to those skilled in the art that the process may be changed for one region selected from the first or second region to be exposed to the oxidizing process twice, and those skilled in the art may easily perform the process by using the information disclosed in the present embodiments.

Referring to FIG. 18, a pad oxide layer 42 with a thickness of about 110 Å, a silicon nitride layer 44 with a thickness of about 1500 Å, and an antireflection layer 46 with a thickness of about 260 Å are successively formed on the align key forming step portion in the scribe line region, and on the semiconductor substrate 10 having exposed step portions in the first and second regions. According to manufacturing circumstances, the antireflection layer 46 can be omitted.

Referring to FIG. 19, a photoresist pattern 50 is formed on the antireflection layer 46 for defining the active region of the semiconductor substrate 10 by using the step, which is formed on the silicon nitride layer 44 by the align key forming step portion in the scribe line region, as the align key.

The align key forming step portion in the scribe line region provides the sufficient step to perform the precise alignment in forming a photoresist pattern 50.

In a semiconductor device according to the above embodiments, an align key forming step portion is formed in a scribe line region by using an oxidization process on a silicon surface, when forming a deep well in a semiconductor substrate prior to forming an active region. Consequently, the align key can be used for precise alignment in defining the active region without requiring an additional photolithography process. As a result, the manufacturing cost for a high voltage device capable of attaining a high breakdown voltage is reduced.

This invention may, however, be embodied in many different forms by those skilled in the art and should not be construed as being limited to the embodiments set forth herein.

What is claimed is:

1. A semiconductor device comprising:
   an align key formed of a first recess having a first depth from a surface of a semiconductor substrate in a scribe line region of the semiconductor substrate; and
   a second step portion formed of a second recess having a second depth from the surface of the semiconductor substrate in a well region of the semiconductor substrate, wherein the second depth is less than or equal to the first depth.

2. The semiconductor device of claim 1, wherein the first recess has a depth of about 400 to 5000 Å.

3. The semiconductor device of claim 1, wherein the second recess has a depth of about 200 to 2500 Å.

4. The semiconductor device of claim 1, wherein the well region is doped by a P-type dopant.

5. The semiconductor device of claim 1, wherein the well region has a well junction depth of about 1 to 12 $\mu$m.

6. The semiconductor device of claim 1, wherein the semiconductor substrate is a substrate for a high voltage device of about 15 to 120 V.

7. The semiconductor device of claim 1, wherein
   the second recess includes an active region and an isolating region for defining the active region, wherein the isolating region is a trench region.

8. The semiconductor device of claim 1, wherein
   the second recess includes an active region and an isolating region for defining the active region, wherein the isolating region is a local oxidation of silicon (LOCOS) isolating region.

9. A semiconductor device comprising:
   an align key formed of a first recess having a first depth from a surface of a semiconductor substrate in a scribe line region of the semiconductor substrate;
   a second step portion formed of a second recess having a second depth from the surface of the semiconductor substrate in a first well region of the semiconductor substrate; and
   a third step portion formed of a third recess having a third depth from the surface of the semiconductor substrate in a second well region of the semiconductor substrate, wherein the third depth is smaller than the first depth.

10. The semiconductor device of claim 9, wherein the first recess has a depth of about 400 to 5000 Å.

11. The semiconductor device of claim 9, wherein the second recess has a depth of about 400 to 5000 Å.

12. The semiconductor device of claim 9, wherein the depth of the third recess is the same as the depth of the second recess.

13. The semiconductor device of claim 9, wherein the first well region is a P-well region.

14. The semiconductor device of claim 9, wherein the second well region is a pocket P-well region.

15. The semiconductor device of claim 9, wherein the first and second well regions have a well junction depth of about 1 to 12 $\mu$m.

16. The semiconductor device of claim 9, wherein the semiconductor substrate is a substrate for a high voltage device of about 15 to 120 V.

17. The semiconductor device of claim 9, wherein the second and third recesses include active regions and isolating regions for defining the active regions, respectively, wherein the isolating regions are trench regions.

18. The semiconductor device of claim 9, wherein the second and third recesses include active regions and isolating regions for defining the active regions, respectively, wherein the isolating regions are LOCOS isolating regions.

19. A method for manufacturing a semiconductor device, the method comprising the steps of:

forming an N-well on a P-type silicon substrate having a scribe line region and a device region;

first implanting a P-type dopant into a portion of the scribe line region and into a first region of the device region on the silicon substrate having the N-well;

forming first oxide layers having a predetermined thickness on the portion of the scribe line region and the first region by oxidizing a surface of the silicon substrate;

forming a P-well in the first region by diffusing the P-type dopant, which is implanted into the first region, into the silicon substrate having the first oxide layer;

forming a first step portion on the surface of the silicon substrate in the scribe line region by removing the first oxide layer formed in the scribe line region;

forming a second step portion on the surface of the P-well by removing the first oxide layer formed in the first region; and forming an align key in the scribe line region by using the first step portion.

20. The method for manufacturing the semiconductor device of claim 19, wherein the P-type dopant is boron ions in the first implanting step.

21. The method for manufacturing the semiconductor device of claim 19, wherein the first oxide layer has a thickness of about 500 to 5000 Å.

22. The method for manufacturing the semiconductor device of claim 19, wherein the P-well has a junction depth of about 1 to 12 μm from the surface of the silicon substrate.

23. The method for manufacturing the semiconductor device of claim 19, wherein removing the first oxide layer formed in the scribe line region and removing the first oxide layer formed in the first region are performed by a wet etching process, respectively.

24. The method for manufacturing the semiconductor device of claim 19, wherein removing the first oxide layers for forming the first and second step portions is simultaneously performed.

25. The method for manufacturing the semiconductor device of claim 19, further comprising the step of forming a first ion implantation mask pattern, which exposes only the portion of the scribe line region and the first region, after forming the N-well and before the first implanting the P-type dopant.

26. The method for manufacturing the semiconductor device of claim 25, wherein the first ion implantation mask pattern is formed of a silicon nitride layer.

27. The method for manufacturing the semiconductor device of claim 19, before forming the align key, further comprising the steps of:

second implanting a P-type dopant into the portion of the scribe line region and a second region of the device region, on the silicon substrate having the first and second step portions;

forming second oxide layers having a predetermined thickness on the first step portion in the scribe line region and on the second region by oxidizing the surface of the silicon substrate;

forming a pocket P-well in the second region by diffusing the P-type dopant, which is implanted into the second region, into the silicon substrate having the second oxide layers;

forming an align key forming step portion on the silicon substrate surface in the scribe line region by removing the second oxide layer from the first step portion; and forming a third step portion on the surface of the pocket P-well by removing the second oxide layer from the second region.

28. The method for manufacturing the semiconductor device of claim 27, wherein the P-type dopant is boron ions in the second implanting step.

29. The method for manufacturing the semiconductor device of claim 27, wherein the second oxide layer has a thickness of about 500 to 5000 Å.

30. The method for manufacturing the semiconductor device of claim 27, wherein the pocket P-well has a junction depth of about 1 to 12 μm from the surface of the semiconductor, which is smaller than the junction depth of the P-well.

31. The method for manufacturing the semiconductor device of claim 27, wherein removing the second oxide layer from the first step portion and removing the second oxide layer from the second region are formed by a wet etching process, respectively.

32. The method for manufacturing the semiconductor device of claim 27, wherein removing the second oxide layers for forming the align key forming step portion and the third step portion is performed simultaneously.

33. The method for manufacturing the semiconductor device of claim 27, wherein a portion of the first oxide layer is removed for remaining a first oxide layer remaining layer having a predetermined thickness in the portion of the scribe line region on the surface of the silicon substrate, in removing the first oxide layer for forming the first step portion step; and the step of second implanting is performed on the first oxide layer remaining layer in the portion of the scribe line region.

34. The method for manufacturing the semiconductor device of claim 27, wherein the align key forming step portion has a larger depth than the second and the third step portions.

35. The method for manufacturing the semiconductor device of claim 27, further comprising the step of forming a first ion implantation mask pattern for exposing the portion of the scribe line region and the first region after forming N-well and before first implanting the P-type dopant.

36. The method for manufacturing the semiconductor device of claim 35, further comprising the step of forming a second ion implantation mask for exposing only the portion of the scribe line region and the second region before the second implanting the P-type dopant.

37. The method for manufacturing the semiconductor device of claim 36, wherein the second ion implantation mask pattern is formed on the first ion implantation mask pattern.

38. The method for manufacturing the semiconductor device of claim 36, wherein the second ion implantation mask pattern is formed of a silicon nitride layer.

39. The method for manufacturing the semiconductor device of claim 27, further comprising the step of forming a photoresist pattern for defining an active region on the silicon substrate, by using the first step portion as an align key.

40. A method for manufacturing a semiconductor device comprising the steps of:

forming a first silicon nitride layer pattern in a scribe line region of a silicon substrate to expose a portion of a surface of the silicon substrate;

forming a first oxide layer by oxidizing the exposed surface of the silicon substrate;

forming a first step portion having a first recess in the scribe line region, by removing the first oxide layer; and forming an align key for defining an active region, by using the first step portion.

41. The method for manufacturing the semiconductor device of claim 40, further comprising the step of forming a deep well in the silicon substrate before forming the first silicon nitride layer pattern.

42. The method for manufacturing the semiconductor device of claim 40, wherein the first oxide layer has a thickness of about 500 to 5000 Å.

43. The method for manufacturing the semiconductor device of claim 40, wherein the first oxide layer is removed by a wet etching process.

44. The method for manufacturing the semiconductor device of claim 40, further comprising the steps of:

forming a second oxide layer by oxidizing the surface of the silicon substrate, which is exposed in the forming a first step portion step; and forming a second step portion formed by a second recess that is deeper than the first recess in the scribe line region, by removing the second oxide layer.

45. The method for manufacturing the semiconductor device of claim 44, further comprising the step of forming a second silicon nitride layer pattern on the first silicon nitride layer pattern for exposing the first step portion after forming the first step portion and before forming the second oxide layer.

46. The method for manufacturing the semiconductor device of claim 44, wherein the second oxide layer has a thickness of about 500 to 5000 Å.

47. The method for manufacturing the semiconductor device of claim 44, wherein the second oxide layer is removed by a wet etching process.

* * * * *